United States Patent
Takenaka

(10) Patent No.: US 6,803,606 B2
(45) Date of Patent: Oct. 12, 2004

(54) LIGHT EMITTING DEVICE AND MANUFACTURING METHOD THEREOF

(75) Inventor: Yasuji Takenaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/390,180

(22) Filed: Mar. 18, 2003

(65) Prior Publication Data

US 2003/0183852 A1 Oct. 2, 2003

(30) Foreign Application Priority Data

Mar. 20, 2002 (JP) .......................... 2002-078119

(51) Int. Cl.$^7$ .............................................. H01L 29/22
(52) U.S. Cl. ........................... 257/98; 257/13; 257/103; 438/22; 438/29
(58) Field of Search ........................ 257/98, 13, 103; 438/22, 25, 26, 27, 29

(56) References Cited

U.S. PATENT DOCUMENTS 5,990,497 A * 11/1999 Kamakura et al. ............ 257/94
2002/0121645 A1 * 9/2002 Yasukawa et al. ............ 257/99
2003/0218228 A1 * 11/2003 Furukawa et al. .......... 257/432

FOREIGN PATENT DOCUMENTS

| JP | 08-264683 | 10/1996 |
| JP | 11-204840 | 7/1999 |
| JP | 2001-308389 | 11/2001 |

* cited by examiner

*Primary Examiner*—David Nelms
*Assistant Examiner*—Long Tran
(74) *Attorney, Agent, or Firm*—Morrison & Foerster LLP

(57) ABSTRACT

A semiconductor light device includes a light emitting element, a reflector for reflecting a light beam outgoing from the light emitting element and a resin disposed between the light emitting element and the reflector, which are formed on a substrate. A face of the reflector is formed into a rough surface to improve adherence between the reflector and the resin for preventing detachment of the reflector from the resin.

10 Claims, 3 Drawing Sheets

LIGHT EMITTING DEVICE AND MANUFACTURING METHOD THEREOF

BACKGROUND OF THE INVENTION

The present invention relates to a light emitting device and a manufacturing method thereof.

As shown in FIG. 3, a light emitting device has conventionally been made up of a substrate 101, a semiconductor light emitting element 103 fixed onto the substrate 101 with use of Ag (silver) paste 102, a gold wire 104 bonded to the semiconductor light emitting element 103 and connected to an unshown electrode, two reflectors 107 disposed around the semiconductor light emitting element 103 for reflecting a light beam from the semiconductor light emitting element 103, and a resin 109 disposed between these two reflectors 107, 107 for sealing the light emitting element 103 and the gold wire 104. The reflector 107 is formed from a liquid crystal polymer having high heat resistance in consideration of influence of heat from the semiconductor light emitting element 103. A light reflecting surface 107a of the reflector 107 located on the side of the semiconductor light emitting element 103 is left untreated or mirror-finished.

However, adherence between the reflector 107 and the resin 109 is poor because the conventional light emitting device is formed such that the light reflecting surface 107a of the reflector is left untreated or mirror-finished. Consequently, there is the possibility that the reflector 107 is detached from the resin 109 due to heat generated in mounting the light emitting device or heat generated in operating the light emitting device. Proceeding in detachment of the reflector 107 from the resin 109 induces detachment of the substrate 101 from the resin 109. As a result, due to stress caused by the detachment of the substrate 101 from the resin 109, there is imposed such serious problem as destruction in connection between the semiconductor light emitting element 103 and the gold wire 104. Further, when adherence between the reflector 107 and the resin 109 is poor, water may disadvantageously invade into a detachment portion between the reflector 107 and the resin 109.

SUMMARY OF THE INVENTION

An object of the present invention is to provide a light emitting device capable of preventing detachment of a reflector from a resin.

In order to accomplish the above object, the present invention a light emitting device comprising:

a substrate;

a light emitting element on the substrate;

a reflector on the substrate for reflecting a light beam outgoing from the light emitting element; and a resin disposed between the light emitting element and the reflector on the substrate, wherein a face of the reflector that reflects a light beam outgoing from the light emitting element is formed into a rough surface.

According to the above configuration, the face of the reflector that reflects a light beam outgoing from the light emitting element is formed into a rough surface, so that adherence between the reflector and the resin through the rough surface of the reflector becomes relatively larger. Therefore, the reflector is hardly detached from the resin even if, for example, the light emitting device receives heat during mounting the light emitting device on the substrate or during operating the light emitting device. This ensures avoidance of such disadvantage as the substrate being detached from the resin, a bonding wire connected to the light emitting element being disconnected due to the detachment of the substrate from the resin, and water entering through a detachment portion between the reflector and the resin, thereby causing malfunction of the light emitting device.

In one embodiment of the present invention, the rough surface of the reflector has an arithmetic mean roughness ranging of 1 $\mu$m or more and 20 $\mu$m or less.

According to the above embodiment, adherence between the reflector and the resin through the rough surface of the reflector becomes appropriate. When the arithmetic mean roughness of the rough surface is smaller than 1 $\mu$m, adherence between the reflector and the resin becomes insufficient to unavoidably cause such a problem as detachment of the reflector from the resin. When the arithmetic mean roughness of the rough surface is larger than 20 $\mu$m, a reflecting amount of light on the rough reflecting surface becomes insufficient, which makes luminance of a light beam emitted by the light emitting device insufficient.

In one embodiment of the present invention, the reflector is made of a liquid crystal polymer.

According to the above embodiment, the liquid crystal polymer of which the reflector is made has good heat resistance, but has difficulty in adhering to the resin. However, since the reflector has a rough surface, sufficient adherence may be obtained between the reflector and the resin via the rough surface. Therefore, the reflector made of the liquid crystal polymer has a stable light reflecting function even if the temperature of the light emitting device is raised by light emitting operation and the like, and the problem of detachment of the reflector from the resin is avoided, which achieves stable provision of the light emitting device having good performance.

In one embodiment of the present invention, the liquid crystal polymer contains a glass at a rate of more than 0 wt % and equal to or less than 30 wt %.

According to the above embodiment, the reflector has good strength since the reflector is made of the liquid crystal polymer containing a glass. Here, when a rate of the glass contained in the liquid crystal polymer is more than 30 wt %, there increases a light beam outgoing from the light emitting element that transmits the reflector. Thereby, there is the possibility that luminance of the light emitting device may decrease and that a light beam may leak to the lateral side of the light emitting device. Also, there is a disadvantage that a mold is remarkably worn away where the reflector made of the liquid crystal polymer containing more than 30 wt % is manufactured by injection molding for example.

In one embodiment of the present invention, the liquid crystal polymer contains titanium oxide at a rate of more than 0 wt % and equal to or less than 30 wt %.

According to the above embodiment, reflectance of light increases since the reflector is made of a liquid crystal polymer containing titanium oxide. When a rate of titanium oxide contained in the liquid crystal polymer is more than 30 wt %, a resin flow of the liquid crystal polymer containing titanium oxide is deteriorated. Therefore, stable molding is not attainable when the reflector is manufactured by injection molding for example.

In one embodiment of the present invention, the liquid crystal polymer contains calcium oxide at a rate of more than 0 wt % and equal to or less than 50 wt %.

According to the above embodiment, the liquid crystal polymer containing not more than 50 wt % calcium oxide enables a rough surface to be stably formed. That is, the reflector made of the above-stated liquid crystal polymer enables formation of a rough surface having good adherence to resin. When a rate of calcium oxide contained in the liquid crystal polymer is more than 50 wt %, heat resistance and strength of the reflector decrease since a rate of the liquid crystal polymer decreases.

In one embodiment of the present invention, the liquid crystal polymer contains a glass at a rate of 20 wt % or more and 30 wt % or less, and also contains titanium oxide at a rate of 20 wt % or more and 30 wt % or less.

According to the above embodiment, the above liquid crystal polymer makes it possible to obtain a reflector having good strength and light reflectance. When the rate of the glass is less than 20 wt %, heat resistance and mechanical strength of the reflector are decreased. When the rate of the glass is more than 30 wt %, a light transmission amount of the reflector increases. Thereby, luminance of the light emitting device decreases, and a light beam leaks to the lateral side of the light emitting device. Also, When the rate of the glass is more than 30 wt %, a mold in molding the reflector is remarkably worn away. Further, when a rate of the titanium oxide is less than 20 wt %, the light reflecting rate and strength of the reflector are decreased. When the rate of the titanium oxide is more than 30 wt %, the reflector is not stably formed since a resin flow of the liquid crystal polymer containing titanium oxide is deteriorated in molding the reflector.

In one embodiment of the present invention, the liquid crystal polymer contains a glass at a rate of 5 wt % or more and 25 wt % or less, contains titanium oxide at a rate of 5 wt % or more and 25 wt % or less, and contains calcium oxide at a rate of 5 wt % or more and 25 wt % or less.

According to the above embodiment, the above liquid crystal polymer makes it possible to form a reflector having good strength and light reflectance, and a rough surface may be stably formed on the reflector, so that good adherence between the rough surface and the resin may be obtained. When a rate of the glass is less than 5 wt %, strength of the reflector becomes insufficient. When a rate of the glass is more than 25 wt %, a light transmission rate of the reflector is raised, which causes such disadvantage as shortage of luminance of the light emitting device and leakage of a light beam to the lateral side of the light emitting device. When a rate of the titanium oxide is less than 5 wt %, a light reflecting rate of the reflector is reduced. When a rate of the titanium oxide is more than 25 wt %, a resin flow is deteriorated in molding the reflector, which makes it difficult to stably form the reflector. When a rate of the calcium oxide is less than 5 wt %, it becomes difficult to stably form a rough surface on the reflector. When a rate of the calcium oxide is more than 25 wt %, heat resistance and strength of the reflector are decreased.

In one embodiment of the present invention, the resin is an epoxy resin whose glass-transition temperature is 40° C. or more and 100° C. or less.

According to the above embodiment, good temperature cycling resistance and reflow resistance is obtained since the resin is an epoxy resin whose glass-transition temperature is 40° C. or more and 100° C. or less. If the glass-transition temperature is less than 40° C., there is the possibility that the resin is deformed in use of the light emitting device under general environments. If the glass-transition temperature is larger than 100° C., here is the possibility that reflow resistance is deteriorated. Also, a coefficient of linear expansion of the resin is almost identical to a coefficient of linear expansion of the reflector. Therefore, detachment of the resin from the reflector is unlikely to occur even if the temperature of the light emitting device rises.

In one embodiment of the present invention, the light emitting element is wire-bonded by a gold wire, breaking strength of which is 100 mN or more at a normal temperature.

According to the above embodiment, the gold wire has breaking strength of 100 mN or more and is good in temperature cycling resistance. Therefore, the light emitting device whose light emitting element is wire-bonded by the gold wire fulfills performance stably maintained for a long period of time under the condition that rise and fall of temperature are repeated by repeated operation of the light emitting device.

The present invention also provides a method for manufacturing a light emitting device, comprising:

forming a rough-surface on a liquid crystal polymer for a reflector with use of an alkaline solution;

washing the alkaline solution;

neutralizing the alkaline solution remained on the liquid crystal polymer with use of acid; and drying the liquid crystal polymer.

According to the above structure, the liquid crystal polymer for the reflector is exposed to the alkaline solution to form the rough surface easily and efficiently, so that the rough surface of the reflector improves adherence between the reflector and the resin.

In one embodiment of the present invention, the liquid crystal polymer for the reflector is exposed for one minute or more to the alkaline solution containing KOH at a rate of 20 wt % or more and 50 wt % or less, a temperature of the alkaline solution being 50° C. or more so as to form the rough surface.

According to the above embodiment, the rough surface is appropriately formed on the liquid crystal polymer for the reflector.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention will be described in detail in conjunction with the embodiment with reference to drawings.

Figure 1:
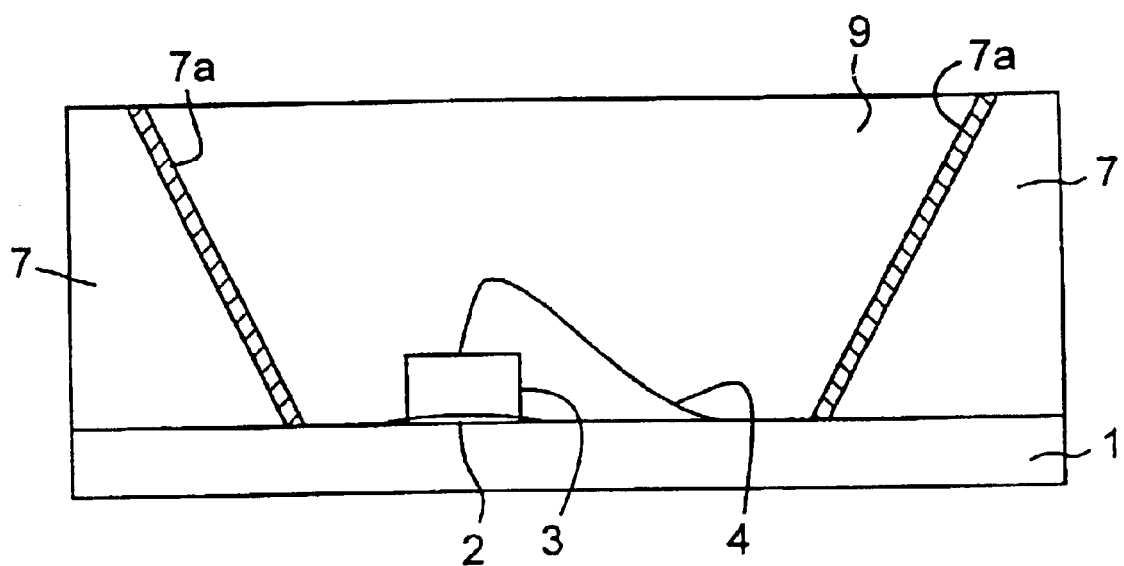
FIG. 1 is a view showing a light emitting device in an embodiment of the present invention.

FIG. 1 is a view showing a light emitting device in an embodiment of the present invention. In the light emitting device, a semiconductor light emitting element 3 is fixed onto a resin substrate 1 serving as a substrate with use of an Ag paste 2. The semiconductor light emitting element 3 is wire-bonded by a gold wire 4 and connected to an unshown electrode. The gold wire 4 has breaking strength of 100 mN or more at the normal temperature. As shown in FIG. 1, two reflectors 7, 7 are disposed on the substrate 1 to reflect a light beam from the semiconductor light emitting element 3 and located on the both right and left sides of the semiconductor light emitting element 3 to guide the light beam upward. The reflectors 7 are formed from a liquid crystal polymer. The liquid crystal polymer contains a glass at a rate of 5 wt % to 25 wt %, titanium oxide at a rate of 5 wt % to 25 wt %, and calcium oxide at a rate of 5 wt % to 25 wt %. Reflecting faces 7a, 7a are faces of the reflectors 7 located on the side of the semiconductor light emitting element 3, and are formed to have rough surfaces of arithmetic mean roughness from 1 μm to 20 μm. The reflectors 7, 7 are bonded to the substrate 1 with an epoxy adhesive. A transparent epoxy resin 9, which glass-transition temperature is between 40° C. and 100° C., is disposed on the substrate 1 between the two reflectors 7, 7. The epoxy resin 9 seals the semiconductor light emitting element 3 and the gold wire 4.

Figure 2:
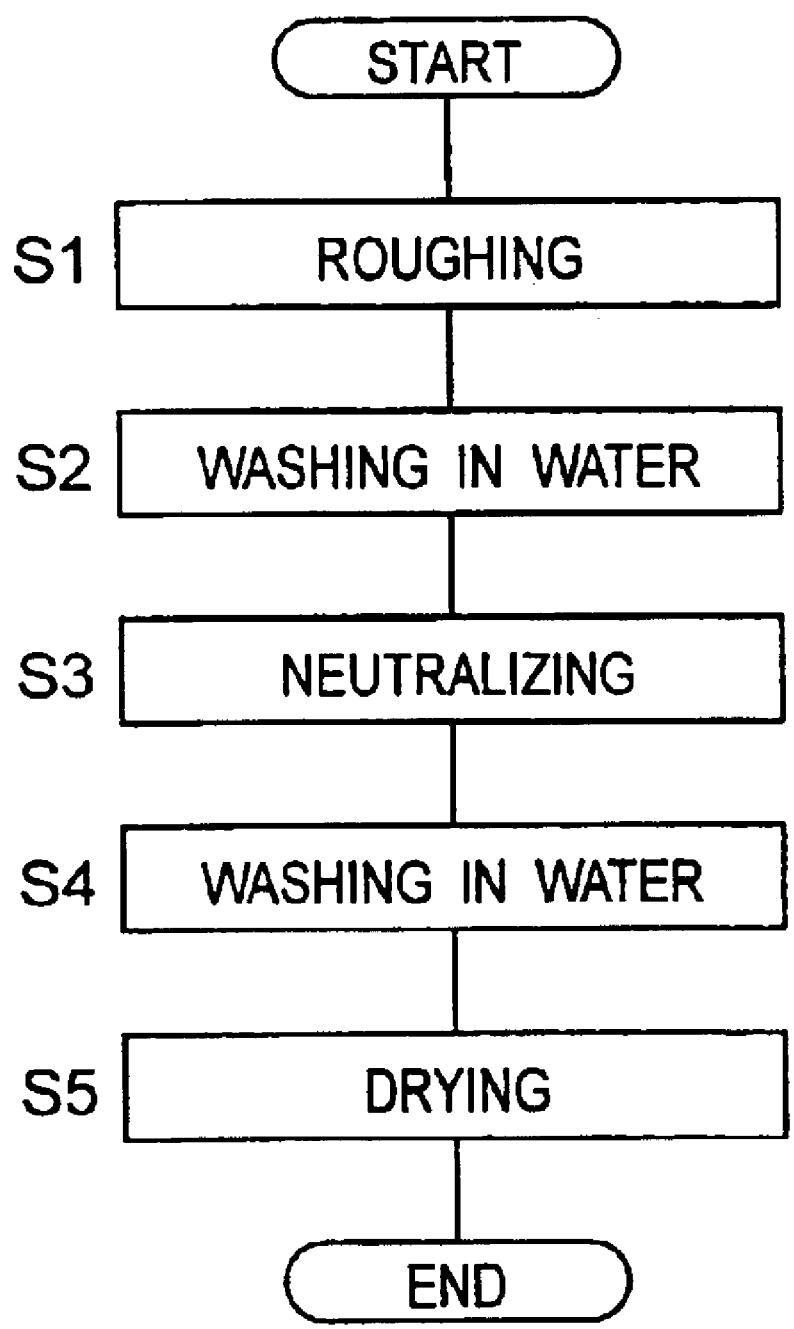
FIG. 2 is a flowchart showing steps of forming a rough surface on a reflector.
Figure 3:
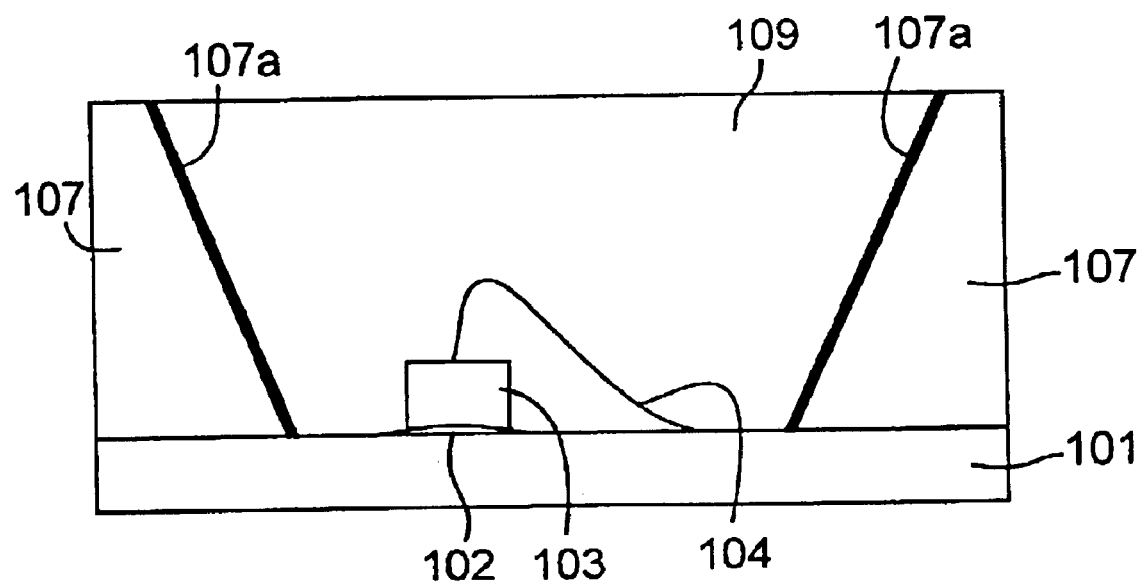
FIG. 3 is a view showing a conventional light emitting device.

FIG. 2 is a flowchart showing steps of forming a rough surface on a liquid crystal polymer constituting the reflector 7. The steps of forming a rough surface on the liquid crystal polymer utilize the characteristic that the liquid crystal polymer tends to react with an alkaline solution. First in the step 1, a specified face of the liquid crystal polymer corresponding to the reflecting face 7a of the reflector is dipped for one minute or more in an alkaline solution so as to rough the face. The alkaline solution contains KOH at a rate of 20 wt % to 50 wt % and has a temperature of 50° C. or more. Depending on the roughness of a rough surface to be formed, KOH contained in the alkaline solution is adjusted within the range from 20 wt % to 50 wt %. Preferably, KOH is adjusted within the range from 35 wt % to 45 wt %. Also, the temperature of the alkaline solution is preferably from 80° C. to 90° C. A period of time for dipping the liquid crystal polymer in the alkaline solution is preferably in the range from 3 to 7 minutes. Prior to the roughing step, an annealing step may be applied for maintaining strength of the liquid crystal polymer or stabilizing the dimension thereof.

Next in the step 2, the alkaline solution attached to the liquid crystal polymer is removed by running water.

Then in the step 3, with use of diluted sulfuric acid and the like, the alkaline solution remained in the liquid crystal polymer in the step 1 is neutralized. If a light emitting device is formed with the alkaline solution remained in the liquid crystal polymer, there is the possibility that other electronic components are affected. Therefore, a step of neutralizing a residual alkaline solution is essential.

Next in the step 4, the diluted sulfuric acid used in the neutralizing step of the step 3 and remained in the liquid crystal polymer is removed by water and supersonic wave.

Finally in the step 5, a liquid crystal polymer with a rough surface formed thereon is dried.

The steps of forming a rough surface on the liquid crystal polymer may be performed either before. or after mounting the liquid crystal polymer on the substrate.

The reflector 7 adheres to the epoxy resin 9 with relatively larger adherence by a rough surface of the reflecting face 7a formed by the above method. Consequently, the reflector 7 is hardly detached from the epoxy resin 9 even if the light emitting device receives heat when the light emitting device is mounted on a specified substrate or the light emitting device is under operation. This ensures avoidance of such disadvantages as the substrate 1 of the light emitting device being detached from the epoxy resin 9, the gold wire 4 connected to the light emitting element 3 being disconnected due to the detachment of the substrate 1 from the epoxy resin 9, and water entering through a detachment portion between the reflector 7 and the epoxy resin 9, thereby causing malfunction of the light emitting device.

In the above embodiment, the liquid crystal polymer forming the reflector 7 contains a glass at a rate of from 5 wt % to 25 wt %, titanium oxide at a rate of from 5 wt % to 25 wt %, and calcium oxide at a rate of from 5 wt % to 25 wt %. However, the liquid crystal polymer may contain only a glass at a rate of from 0 wt % to 30 wt %. Also, the liquid crystal polymer may contain only titanium oxide at a rate of from 0 wt % to 30 wt %. Further, the liquid crystal polymer may contain a glass at a rate of from 20 wt % to 30 wt % together with titanium oxide at a rate of from 20 wt % to 30 wt %.

Further, the rough surface formed on the reflector 7 is not limited to the reflecting face 7a, but may be formed on the upper and lower faces of the reflector. In the case where the rough surface is formed on the upper face of the reflector 7, adherence between an interconnection pattern printed on the upper face and the reflector 7 may be effectively increased. In the case where the rough surface is formed on the lower face of the reflector 7, adherence between the reflector 7 and the substrate 1 may be effectively increased through an adhesive disposed therebetween.

Further, the epoxy resin 9 is not limited to be of transparent but may be colored with milky white or other colors.

Although the substrate 1 is made of resin in the above embodiments, it may be made of metal. In this case, an insert molding method allows the reflector of the liquid crystal polymer to be effectively formed on the metal substrate.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A light emitting device comprising:
   a substrate;
   a light emitting element on the substrate;
   a reflector on the substrate for reflecting a light beam outgoing from the light emitting element; and
   a resin disposed between the light emitting element and the reflector on the substrate,
   wherein a face of the reflector on that reflects a light beam outgoing from the light emitting element is formed into a rough surface.

2. The light emitting device as defined in claim 1,
   wherein the rough surface of the reflector has an arithmetic mean roughness ranging of 1 μm or more and 20 μm or less.

3. The light emitting device as defined in claim 1,
   wherein the resin is an epoxy resin whose glass-transition temperature is 40° C. or more and 100° C. or less.

4. The light emitting device as defined in claim 1,
   wherein the light emitting element is wire-bonded by a gold wire, breaking strength of which is 100 mN or more at a normal temperature.

5. The light emitting device as defined in claim 1,
   wherein the reflector is made of a liquid crystal polymer.

6. The light emitting device as defined in claim 5,
   wherein the liquid crystal polymer contains a glass at a rate of more than 0 wt % and equal to or less than 30 wt %.

7. The light emitting device as defined in claim 5,
   wherein the liquid crystal polymer contains titanium oxide at a rate of more than 0 wt % and equal to or less than 30 wt %.

8. The light emitting device as defined in claim 5,
   wherein the liquid crystal polymer contains calcium oxide at a rate of more than 0 wt % and equal to or less than 50 wt %.

9. The light emitting device as defined in claim 5,
   wherein the liquid crystal polymer contains a glass at a rate of 20 wt % or more and 30 wt % or less, and also contains titanium oxide at a rate of 20 wt % or more and 30 wt % or less.

10. The light emitting device as defined in claim 5,
    wherein the liquid crystal polymer contains a glass at a rate of 5 wt % or more and 25 wt % or less, contains titanium oxide at a rate of 5 wt % or more and 25 wt % or less, and contains calcium oxide at a rate of 5 wt % or more and 25 wt % or less.

* * * * *